United States Patent
Yuan et al.

(10) Patent No.: US 8,719,757 B2
(45) Date of Patent: May 6, 2014

(54) METHOD TO ENHANCE DOUBLE PATTERNING ROUTING EFFICIENCY

(75) Inventors: Lei Yuan, Sunnyvale, CA (US); Jongwook Kye, Pleasanton, CA (US)

(73) Assignee: GlobalFoundries Inc., Grand Cayman (KY)

( * ) Notice: Subject to any disclaimer, the term of this patent is extended or adjusted under 35 U.S.C. 154(b) by 0 days.

(21) Appl. No.: 13/603,304

(22) Filed: Sep. 4, 2012

(65) Prior Publication Data
US 2014/0068543 A1   Mar. 6, 2014

(51) Int. Cl.
*G06F 17/50* (2006.01)

(52) U.S. Cl.
USPC .......................................................... 716/126

(58) Field of Classification Search
USPC ................................................ 716/126, 132
See application file for complete search history.

(56) References Cited

U.S. PATENT DOCUMENTS

| | | | |
|---|---|---|---|
| 2011/0225555 A1* | 9/2011 | Yeric | 716/55 |
| 2012/0288786 A1* | 11/2012 | Huang et al. | 430/5 |
| 2012/0289796 A1* | 11/2012 | Esenaliev et al. | 600/316 |
| 2012/0317524 A1* | 12/2012 | Taoka | 716/53 |
| 2012/0329266 A1* | 12/2012 | Hiramoto et al. | 438/618 |

OTHER PUBLICATIONS

Lei Yuan et al., U.S. Appl. No. 13/418,895, filed Mar. 13, 2012.

* cited by examiner

*Primary Examiner* — Vuthe Siek
*Assistant Examiner* — Mohammed Alam
(74) *Attorney, Agent, or Firm* — Ditthavong Mori & Steiner, P.C.

(57) ABSTRACT

A method for enabling jogging functionality in circuit designs utilizing DPT without the need for difficult to implement tools such as stitch-aware routing tools is disclosed. Embodiments include: displaying a user interface for generating an IC having a plurality of masks for a single layer; causing, at least in part, a presentation in the user interface of a cell placement of the IC that includes a filler cell; and designating a portion of the filler cell as a routing zone, the routing zone being configured such that routes placed in the routing zone are decomposable with other routes placed outside the filler cell.

18 Claims, 7 Drawing Sheets

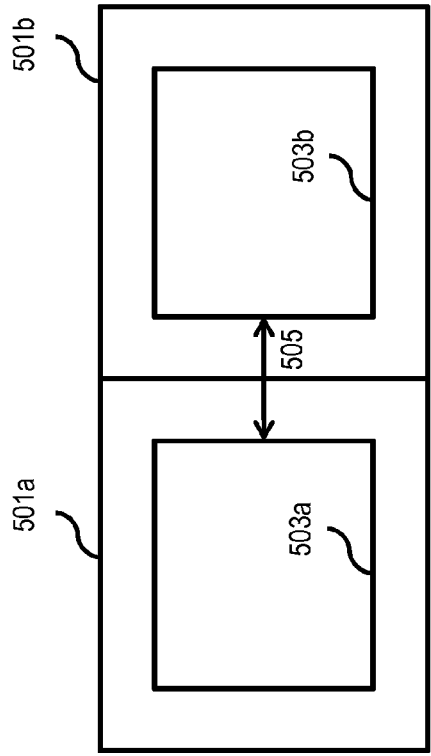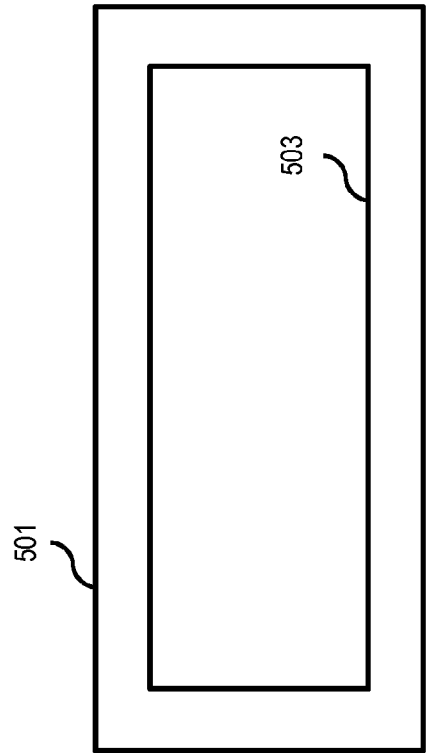
FIG. 5A
FIG. 5B

METHOD TO ENHANCE DOUBLE PATTERNING ROUTING EFFICIENCY

TECHNICAL FIELD

The present disclosure relates to a selection and placement of route patterns in an integrated circuit (IC) to relieve routing jogs. The present disclosure is particularly applicable to IC designs in 20 and 14 nanometer (nm) technology nodes and beyond utilizing double patterning technology (DPT).

BACKGROUND

Features (e.g., routes) and pitches (e.g., spacing between features) of IC designs continue to decrease in size. In order to support such features and pitches, many IC designs form features utilizing DPT. FIG. 1 illustrates an exemplary DPT process. As shown, an overall route pattern 101 is generated from a partial route pattern 101a formed by a first mask and a partial route pattern 101b formed by a second mask. By using two separate masks, the pitch 103 between features using DPT may be less (e.g., half) than a pitch using a single mask, such as pitch 103a and pitch 103b.

IC designs utilizing DPT, however, require zero odd cycle for the designs to be decomposable by the separate masks. FIG. 2 illustrates an exemplary even cycle that is decomposable utilizing DPT, and FIG. 3A illustrates an exemplary odd cycle that is not decomposable utilizing DPT.

Adverting to FIG. 2, the target pattern 201 has features 203, 205, 207, and 209 which have a pitch 211 (e.g., pitch 211a, 211b, 211c, and 211d), between each vertical or horizontal pair, that a single mask cannot decompose. However, an even number (e.g., two) of masks may decompose the target pattern 201. Specifically, a first mask may decompose a partial pattern 201a having features 203 and 209 because a pitch 213a (along the diagonal) separating the features is greater than a minimum pitch for a single mask. Likewise, a second mask may decompose a partial pattern 201b having features 205 and 207 because a pitch 213b (along another diagonal) separating the features is also greater than a minimum pitch for a single mask. Thus, although nearby features have a pitch 211 requiring separate masks to decompose the features 203 through 209, the target pattern 201 is nonetheless decomposable using DPT.

Adverting to FIG. 3A, the target pattern 301 is not decomposable using DPT. The features 303, 305, and 307 of target pattern 301 have a pitch 309 (e.g., 309a, 309b, and 309c) for each pair that a single mask cannot decompose. Specifically, a mask may only decompose one of features 303 through 307 because pitch 309 separating the features is less than a minimum pitch for a single mask. Thus, an odd (e.g., three) number of masks are required to decompose the target pattern 301, rendering DPT unable to decompose the target pattern 301.

To avoid odd cycles in IC designs utilizing DPT technology, routing jogs are highly discouraged since they often lead to odd cycles. For example, as illustrated in FIG. 3B, routing jog 311 creates odd cycle 313. However, such a restriction degrades routing efficiency and may lead to the consumption of additional chip area. Thus, traditional designs utilizing DPT frequently suffer from poor routing efficiency.

One solution to the poor routing efficiency is the use of an additional route pattern in the IC design to perform the jogging function. However this additional route pattern is very difficult to implement using traditional methods because IC designs must utilize a stitch-aware routing tool for connecting the two route patterns to avoid odd cycles.

A need therefore exists for a methodology enabling the jogging function to improve routing efficiency without the need for difficult to implement tools such as stitch-aware routing tools.

SUMMARY

An aspect of the present disclosure is a user interface designating a portion of a filler cell as a routing zone.

Another aspect of the present disclosure is a circuit having a filler cell with a routing pattern surrounded by an area without any routes.

Additional aspects and other features of the present disclosure will be set forth in the description which follows and in part will be apparent to those having ordinary skill in the art upon examination of the following or may be learned from the practice of the present disclosure. The advantages of the present disclosure may be realized and obtained as particularly pointed out in the appended claims.

According to the present disclosure, some technical effects may be achieved in part by a method including: displaying a user interface for generating an IC having a plurality of masks for a single layer; causing, at least in part, a presentation in the user interface of a cell placement of the IC that includes a filler cell; and designating a portion of the filler cell as a routing zone, the routing zone being configured such that routes placed in the routing zone are decomposable with other routes placed outside the filler cell.

Some aspects include a method wherein the routing zone is configured such that a distance from an outer edge of the routing zone to an outer edge of the filler cell exceeds a critical distance, the critical distance being based on a side-to-side, tip-to-side, or tip-to-tip minimum resolution of a single patterning, for at least one of the plurality of masks, or a combination thereof. Further aspects include a method wherein the critical distance is a maximum value of the side-to-side minimum resolution, the tip-to-side minimum resolution, and the tip-to-tip minimum resolution. Additional aspects include merging the routing zone of the filler cell and another routing zone of another filler cell adjacent to the filler cell, the merged routing zone having a distance between an outer edge of the merged routing zone and an outer edge formed by the combination of the another filler cell and the filler cell that exceeds a critical distance. Other aspects include determining whether a route causes a design rule check (DRC) error based on whether the route is within the routing zone. Some aspects include designating that a route within the routing zone cause no DRC error in the IC when the route is determined to cause no DRC error within the routing zone. Further aspects involve including a predetermined route pattern in the filler cell, and determining prior to a placement of the filler cell that the predetermined route pattern is decomposable. Additional aspects include designating that the predetermined route pattern causes no DRC error in the IC if the predetermined route pattern is within the routing zone. Other aspects include orthogonally connecting one or more routes associated with another layer to the routes placed in the routing zone, the another layer being a different layer than a layer associated with the routes placed in the routing zone.

Another aspect of the present disclosure is a circuit including: a plurality of cells of an IC, the plurality of cells including a filler cell having a routing zone containing at least one route and having an area without any routes that surrounds the routing zone; and a layer of routes having a minimum resolution less than a minimum resolution of single patterning of a mask associated with the layer of routes, the minimum resolution being based on a side-to-side, tip-to-side, and tip-to-tip minimum resolution of the layer of routes.

Aspects include a circuit wherein the area without any routes has a distance from an outer edge of the routing zone to an outer edge of the filler cell that exceeds a critical distance, the critical distance being based on the side-to-side minimum resolution, the tip-to-side minimum resolution, the tip-to-tip minimum resolution, or a combination thereof. Some aspects include a circuit wherein the critical distance is a maximum value of the side-to-side minimum resolution, the tip-to-side minimum resolution, and the tip-to-tip minimum resolution. Further aspects include a merged routing zone within the filler cell and another filler cell adjacent to the filler cell, the merged routing zone containing at least one route and surrounded by an area within the filler cell and the another filler cell having no routes. Additional aspects include a circuit wherein the area within the filler cell and the another filler cell has a distance from an outer edge of the merged routing zone to an outer edge of a combination of the filler cell and the another filler cell that exceeds a critical distance, the critical distance being based on the side-to-side minimum resolution, the tip-to-side minimum resolution, the tip-to-tip minimum resolution, or a combination thereof. Some aspects include another filler cell having, in the layer of routes, a route pattern within a routing zone of the another filler cell that is identical to a route pattern, in the layer of routes, within the routing zone of the filler cell. Further aspects include another layer of routes that is orthogonally connected to the layer of routes. Additional aspects include a circuit wherein the minimum resolution is 50 nm and the minimum resolution of a single patterning is 90 nm.

Another aspect of the present disclosure is a method including: displaying a user interface for generating an IC; designating a M1 layer pattern associated with two masks using DPT having a side-to-side, tip-to-side, and tip-to-tip minimum resolution of a single patterning; designating a M2 layer pattern that is orthogonally connected to the M1 layer pattern; causing, at least in part, a presentation in the user interface of a cell placement of the IC that includes a filler cell; designating a portion of the filler cell as a routing zone, the routing zone configured such that a distance from an outer edge of the routing zone to an outer edge of the filler cell exceeds a critical distance, the critical distance being the maximum value of the side-to-side minimum resolution, the tip-to-side minimum resolution, and the tip-to-tip minimum resolution; determining whether a route of the M1 layer pattern causes a DRC error based on the whether the route is within the routing zone; and designating that one or more routes of the M1 layer pattern placed within the routing zone cause no DRC error in the IC when the one or more routes are determined to cause no DRC error within the routing zone.

Aspects include merging the routing zone of the filler cell with another routing zone of another filler cell adjacent to the filler cell, the merged routing zone having a distance between an outer edge of the merged routing zone and an outer edge formed by the combination of the another filler cell and the filler cell that exceeds the critical distance. Other aspects include: determining a predetermined route pattern prior to a placement of the filler cell; designating the predetermined route pattern within the filler cell to cause no DRC errors between routes of the predetermined route pattern; and designating the predetermined route pattern to cause no DRC error in the IC when the predetermined route pattern is placed within the routing zone.

Additional aspects and technical effects of the present disclosure will become readily apparent to those skilled in the art from the following detailed description wherein embodiments of the present disclosure are described simply by way of illustration of the best mode contemplated to carry out the present disclosure. As will be realized, the present disclosure is capable of other and different embodiments, and its several details are capable of modifications in various obvious respects, all without departing from the present disclosure. Accordingly, the drawings and description are to be regarded as illustrative in nature, and not as restrictive.

BRIEF DESCRIPTION OF THE DRAWINGS

The present disclosure is illustrated by way of example, and not by way of limitation, in the figures of the accompanying drawing and in which like reference numerals refer to similar elements and in which:

FIGS. 5A and 5B illustrate a merging of adjacent filler cells to form a merged routing zone, in accordance with an exemplary embodiment.

DETAILED DESCRIPTION

In the following description, for the purposes of explanation, numerous specific details are set forth in order to provide a thorough understanding of exemplary embodiments. It should be apparent, however, that exemplary embodiments may be practiced without these specific details or with an equivalent arrangement. In other instances, well-known structures and devices are shown in block diagram form in order to avoid unnecessarily obscuring exemplary embodiments. In addition, unless otherwise indicated, all numbers expressing quantities, ratios, and numerical properties of ingredients, reaction conditions, and so forth used in the specification and claims are to be understood as being modified in all instances by the term "about."

The present disclosure addresses and solves the current problem of routing inefficiency attendant upon utilizing DPT for forming IC routing. In accordance with embodiments of the present disclosure, the problems are solved, for instance by, inter alia, designating, within a filler cell, a routing zone configured to ensure that routes placed in the routing zone are decomposable with routes placed outside the filler cell.

Still other aspects, features, and technical effects will be readily apparent to those skilled in this art from the following detailed description, wherein preferred embodiments are shown and described, simply by way of illustration of the best mode contemplated. The disclosure is capable of other and different embodiments, and its several details are capable of modifications in various obvious respects. Accordingly, the drawings and description are to be regarded as illustrative in nature, and not as restrictive.

Figure 1:
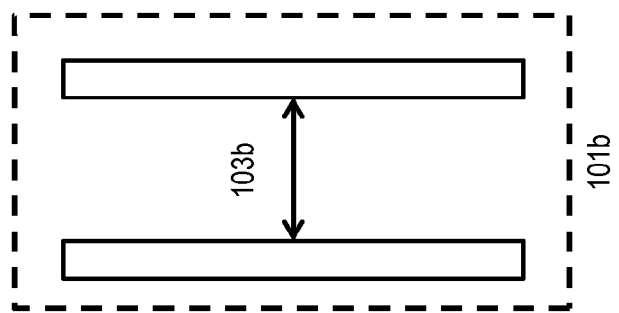
FIG. 1 illustrates an exemplary DPT process.
Figure 1:
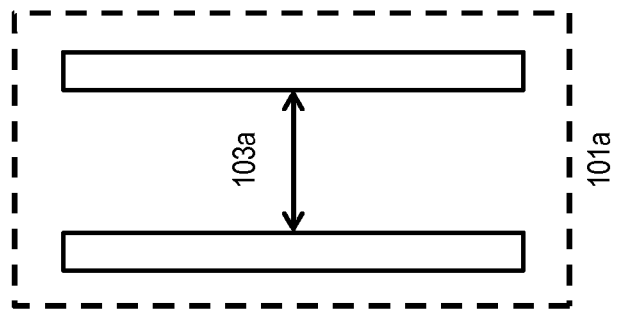
Figure 1:
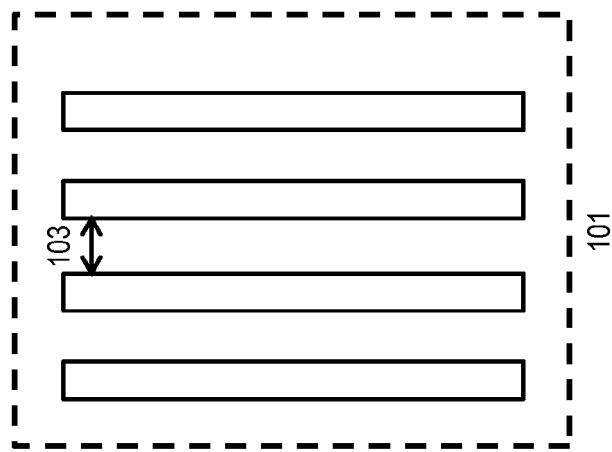
Figure 2:
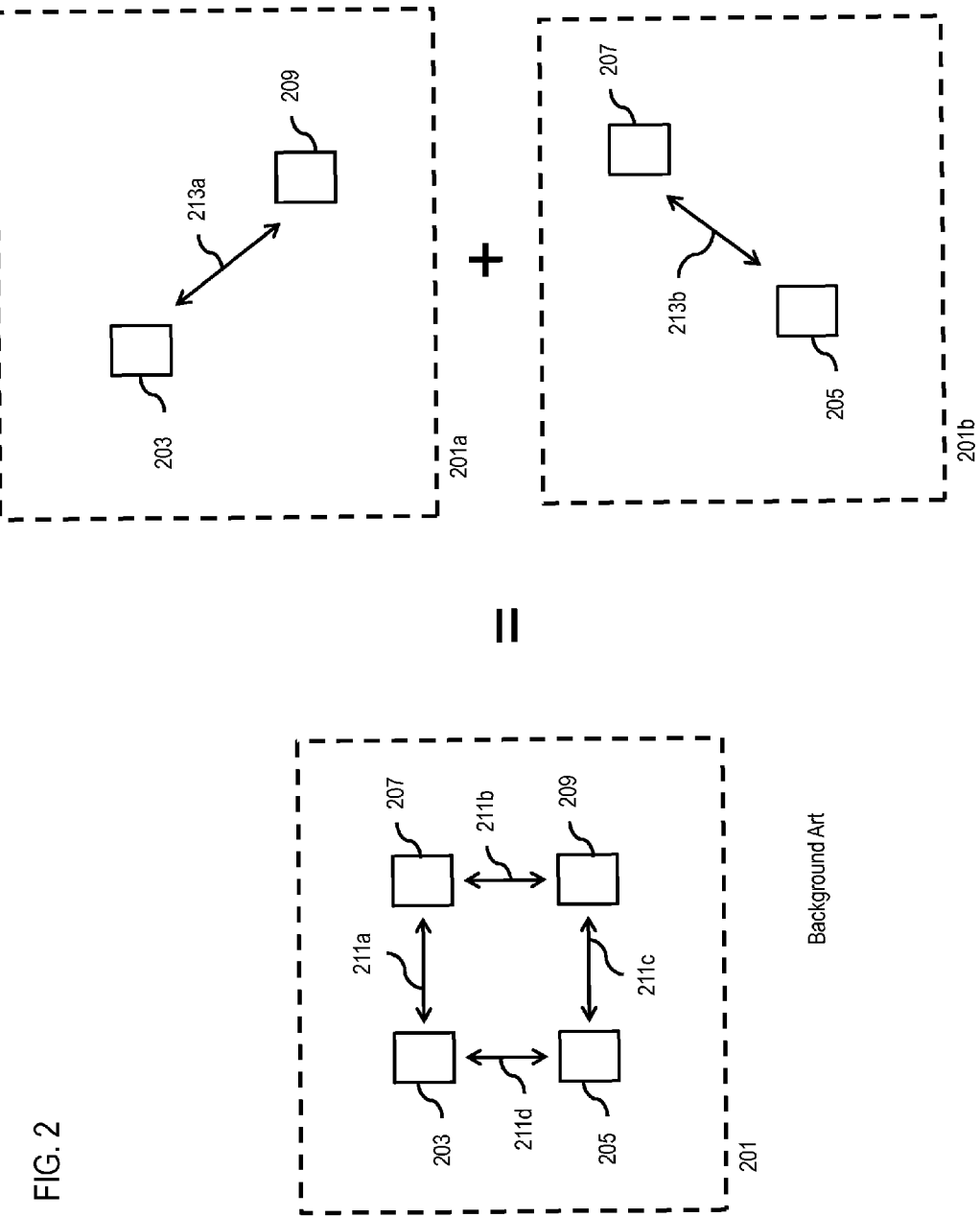
FIG. 2 illustrates an exemplary even cycle that is decomposable utilizing a DPT process.
Figure 3A:
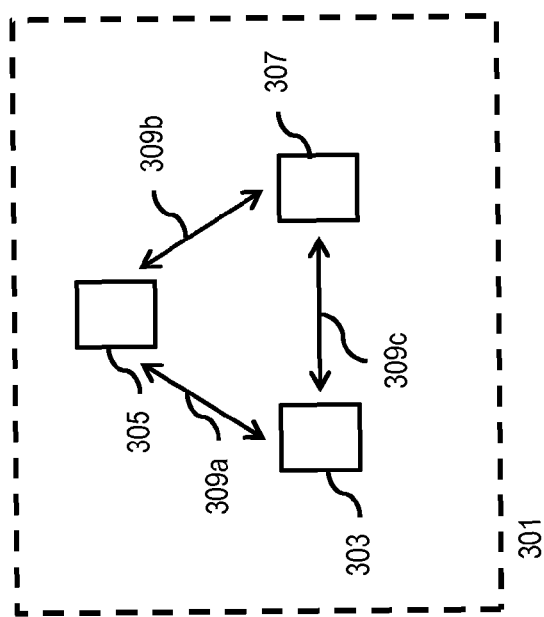
FIG. 3A illustrates an exemplary odd cycle that is not decomposable utilizing a DPT process.
Figure 3B:
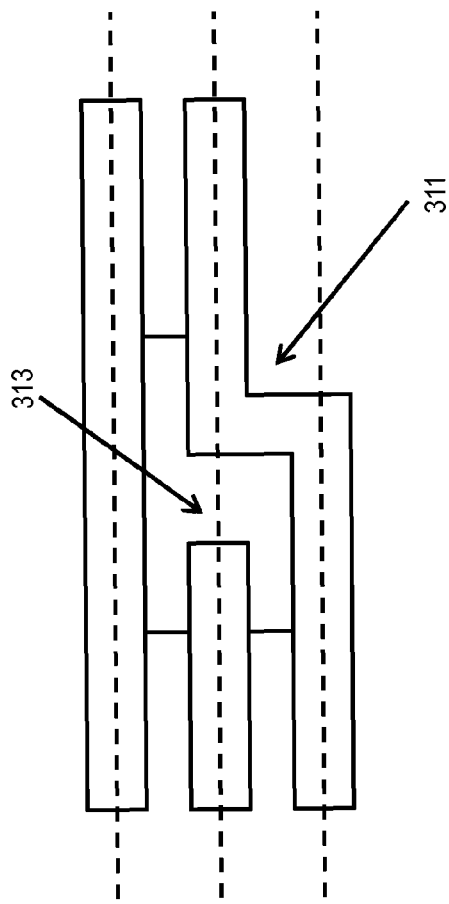
FIG. 3B illustrates a routing jog creating an odd cycle.
Figure 4:
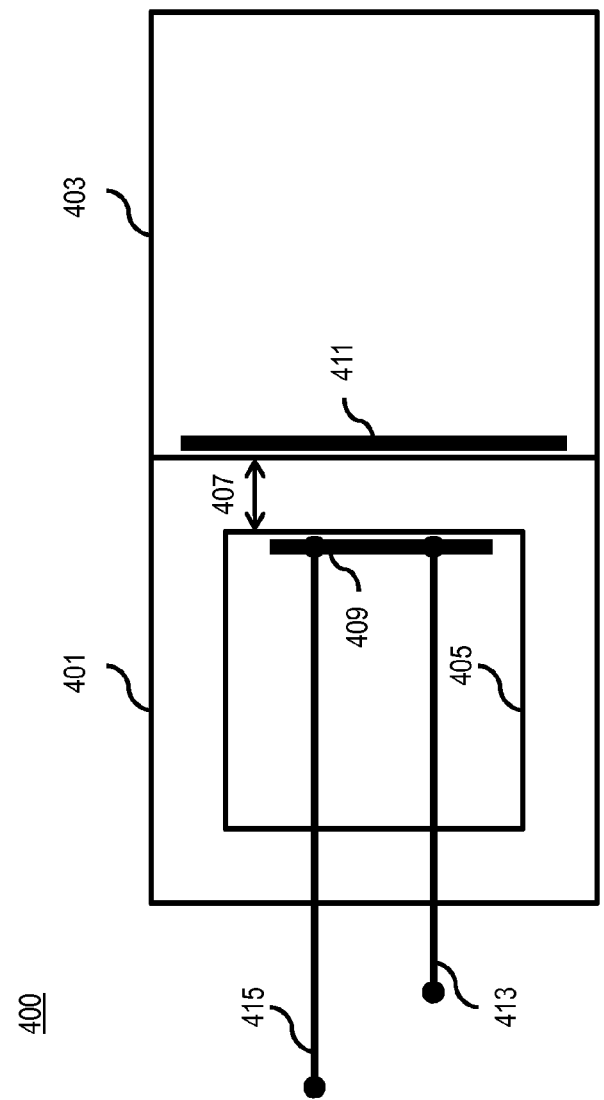
FIG. 4 illustrates a filler cell with a routing zone, in accordance with an exemplary embodiment.

IC circuits include standard cells that are placed and connected through cell placement and routing. Standard cell placement often contains several filler cells for routing and timing optimization, which have no metal 1 (M1) patterns inside. FIG. 4 illustrates a cell placement view 400 of a filler cell 401 and a standard cell 403. The filler cell 401 includes a routing zone 405 configured to maintain a critical distance 407 between an outer edge of the routing zone 405 and an outer edge of the filler cell 401. The critical distance 407 may be selected such that a distance from an outer edge of the routing zone 405 to an outer edge of the filler cell 401 exceeds a side-to-side, tip-to-side, tip-to-tip minimum resolution of a single patterning of a mask, or combination of the minimum resolutions. For instance, to ensure that a routing pattern is decomposable, a critical distance 407 may be selected to be greater than 90 nm for a single mask having a side-to-side minimum resolution of 70 nm, a tip-to-side minimum resolution of 80, and a tip-to-tip minimum resolution of 90 nm. Thus, a route 409 of the routing pattern placed in the routing zone 405 is decomposable even when another route 411, outside the filler cell 401 and of the routing pattern is placed in the standard cell 403, abutting a border between filler cell 401 and standard cell 403.

Further, a DRC check process may benefit from determining whether a route causes a DRC error based on whether the route is within the routing zone. For instance, a DRC check process that determines route 409 to be within routing zone 405 may perform only a partial check process instead of a more rigorous DRC check. Additionally, a route within the routing zone may be designated to cause no DRC error in the IC when the route is determined to cause no DRC error within the routing zone. For instance, a DRC check process that determines route 409 is within routing zone 405 may perform a DRC check process only within the routing zone 405 and then designate the route 409 to be DRC error free. As such, computational effort may be reduced by use of a routing zone (e.g., 405). As previously noted, the jogging function may be performed by routes (e.g., route 409) placed in the routing zone. For instance, FIG. 4 illustrates a first track 413 being jogged to another track 415. To improve routing efficiency, routes or tracks placed in the routing zone in one metal layer may be orthogonally connected with another metal layer. For instance, tracks 413 and 415 of a M2 routing layer are orthogonally connected to route 409 of a M1 routing layer to improve routing efficiency.

FIGS. 5A and 5B illustrate an exemplary embodiment of merging adjacent filler cells to form a merged routing zone. For instance, FIG. 5A illustrates a first filler cell 501a having a first routing zone 503a adjacent to a second filler cell 501b having a second routing zone 503b. As shown, the separation 505 between routing zones 503a and 503b is not necessary because routes placed in routing zones 503a and 503b may be determined to be decomposable with routes from both of the routing zones. Thus, additional routing area may be obtained by merging adjacent filler cells and routing zones. For example, FIG. 5B illustrates, a merged filler cell 501 of filler cells 501a and 501b having a merged routing zone 503 that allows routes to be placed in the previous routing zones 503a and 503b and also in area previously excluded by the separation 505.

Figure 6:
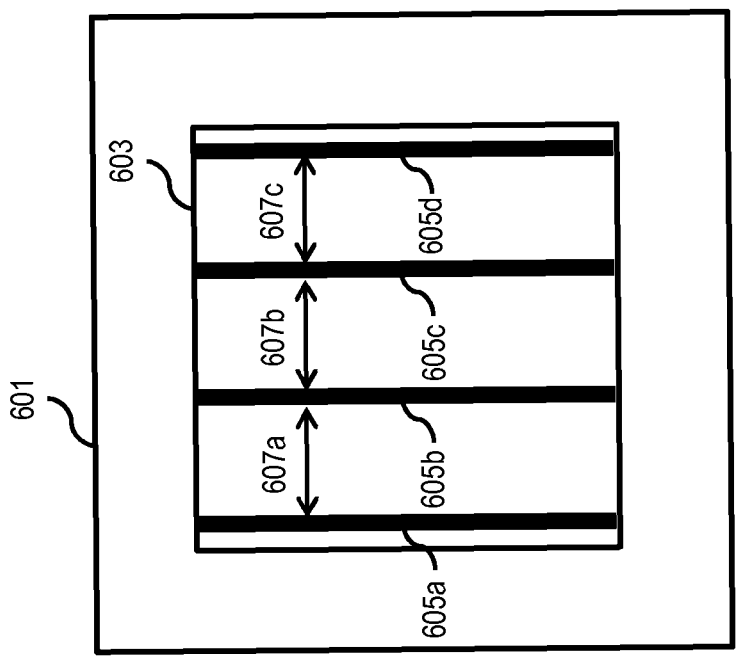
FIG. 6 illustrates a filler cell with a routing zone having a predefined routing pattern, in accordance with an exemplary embodiment.

Adverting to FIG. 6, a filler cell 601 may have a routing zone 603 with a predetermined routing pattern containing routes 605 (e.g., 605a, 605b, 605c, 605d). As illustrated, routes 605 are separated by a distance 607 (e.g., 607a, 607b, 607c). In the exemplary embodiment, the routes 605 and the distance 607 are determined to be decomposable prior to a placement of filler cell 601 in an IC design. For example, the filler cell 601 and routing zone 603 may be associated with a particular critical distance value (e.g., 90 nm), such that designers using masks that can decompose the particular critical distance can simply place the routes 605 in routing zone 603. Further, predefined route patterns placed in routing zones may be designated to cause no DRC error because, for instance, the routing zone 603 along with the selection of a predefined route pattern having an acceptable critical distance ensures the routes to be decomposable. For example, routes 605, previously determined to be decomposable by a mask having a minimum resolution of 90 nm, that are placed in routing zone 603 can be designated to cause no DRC error for a mask capable of decomposing a resolution of at least 90 nm. Additionally, the same predefined route pattern may be placed multiple times in a single IC design, reducing design effort. Similarly, routing zones (e.g., 603) and filler cells (e.g., 601) may also be determined to be decomposable prior to a placement in an IC design.

The embodiments of the present disclosure can achieve several technical effects, including fabricating a circuit utilizing DPT having jogging functionality. The present disclosure enjoys industrial applicability in any circuit design, particularly in IC designs utilizing DPT and in designs for 20 nm and 14 nm manufacturing technologies and below.

In the preceding description, the present disclosure is described with reference to specifically exemplary embodiments thereof. It will, however, be evident that various modifications and changes may be made thereto without departing from the broader spirit and scope of the present disclosure, as set forth in the claims. The specification and drawings are, accordingly, to be regarded as illustrative and not as restrictive. It is understood that the present disclosure is capable of using various other combinations and embodiments and is capable of any changes or modifications within the scope of the inventive concept as expressed herein.

What is claimed is:

1. A method comprising:
    displaying a user interface for generating an integrated circuit (IC) having a plurality of masks for a single layer;
    causing, at least in part, a presentation in the user interface of a cell placement of the IC that includes a filler cell; and
    designating, by a processor, a portion of the filler cell as a routing zone, wherein the routing zone is configured such that a distance from an outer edge of the routing zone to an outer edge of the filler cell exceeds a critical distance, the critical distance being based on a side-to-side, tip-to-side, or tip-to-tip minimum resolution of a single patterning, for at least one of the plurality of masks, or a combination thereof.

2. The method according to claim 1, wherein the critical distance is a maximum value of the side-to-side minimum resolution, the tip-to-side minimum resolution, and the tip-to-tip minimum resolution.

3. The method according to claim 1, comprising merging the routing zone of the filler cell and another routing zone of another filler cell adjacent to the filler cell, the merged routing zone having a distance between an outer edge of the merged routing zone and an outer edge formed by the combination of the another filler cell and the filler cell that exceeds a critical distance.

4. The method according to claim 1, comprising determining whether a route causes a design rule check (DRC) error based on whether the route is within the routing zone.

5. The method according to claim 1, comprising designating that a route within the routing zone cause no DRC error in the IC when the route is determined to cause no DRC error within the routing zone.

6. The method according to claim 1, comprising including a predetermined route pattern in the filler cell, and determining prior to a placement of the filler cell whether the predetermined route pattern causes a design rule check (DRC) error.

7. The method according to claim 6, comprising designating that the predetermined route pattern causes no DRC error in the IC if the predetermined route pattern is within the routing zone.

8. The method according to claim 1, comprising orthogonally connecting one or more routes associated with another layer to the routes placed in the routing zone, the another layer being a different layer than a layer associated with the routes placed in the routing zone.

9. A device comprising:
a plurality of cells of an integrated circuit (IC), the plurality of cells comprising a filler cell having a routing zone containing at least one route and having an area without any routes that surrounds the routing zone; and
a layer of routes having a minimum resolution less than a minimum resolution of single patterning of a mask associated with the layer of routes, the minimum resolution being based on a side-to-side, tip-to-side, and tip-to-tip minimum resolution of the layer of routes, wherein the area without any routes has a distance from an outer edge of the routing zone to an outer edge of the filler cell that exceeds a critical distance, the critical distance being based on the side-to-side minimum resolution, the tip-to-side minimum resolution, the tip-to-tip minimum resolution, or a combination thereof.

10. The device according to claim 9, wherein the critical distance is a maximum value of the side-to-side minimum resolution, the tip-to-side minimum resolution, and the tip-to-tip minimum resolution.

11. The device according to claim 9, comprising a merged routing zone within the filler cell and another filler cell adjacent to the filler cell, the merged routing zone containing at least one route and surrounded by an area within the filler cell and the another filler cell having no routes.

12. The device according to claim 11, wherein the area within the filler cell and the another filler cell has a distance from an outer edge of the merged routing zone to an outer edge of a combination of the filler cell and the another filler cell that exceeds a critical distance, the critical distance being based on the side-to-side minimum resolution, the tip-to-side minimum resolution, the tip-to-tip minimum resolution, or a combination thereof.

13. The device according to claim 9, further comprising another filler cell having, in the layer of routes, a route pattern within a routing zone of the another filler cell that is identical to a route pattern, in the layer of routes, within the routing zone of the filler cell.

14. The device according to claim 9, further comprising another layer of routes that is orthogonally connected to the layer of routes.

15. The device according to claim 9, wherein the minimum resolution is 50 nanometer (nm) and the minimum resolution of a single patterning is 90 nm.

16. A method comprising:
displaying a user interface for generating an integrated circuit (IC);
designating a M1 layer pattern associated with two masks using double patterning technology (DPT) having a side-to-side, tip-to-side, and tip-to-tip minimum resolution of a single patterning;
designating a M2 layer pattern that is orthogonally connected to the M1 layer pattern;
causing, at least in part, a presentation in the user interface of a cell placement of the IC that includes a filler cell;
designating a portion of the filler cell as a routing zone, the routing zone configured such that a distance from an outer edge of the routing zone to an outer edge of the filler cell exceeds a critical distance, the critical distance being the maximum value of the side-to-side minimum resolution, the tip-to-side minimum resolution, and the tip-to-tip minimum resolution;
determining whether a route of the M1 layer pattern causes a design rule check (DRC) error based on the whether the route is within the routing zone; and
designating, by a processor, that one or more routes of the M1 layer pattern placed within the routing zone cause no DRC error in the IC when the one or more routes are determined to cause no DRC error within the routing zone.

17. The method according to claim 16, comprising merging the routing zone of the filler cell with another routing zone of another filler cell adjacent to the filler cell, the merged routing zone having a distance between an outer edge of the merged routing zone and an outer edge formed by the combination of the another filler cell and the filler cell that exceeds the critical distance.

18. The method according to claim 16, comprising:
determining a predetermined route pattern prior to a placement of the filler cell;
designating the predetermined route pattern within the filler cell to cause no DRC errors between routes of the predetermined route pattern; and
designating the predetermined route pattern to cause no DRC error in the IC when the predetermined route pattern is placed within the routing zone.

* * * * *